United States Patent

Maclellan

[19]

[11] Patent Number: 5,878,059
[45] Date of Patent: Mar. 2, 1999

[54] METHOD AND APPARATUS FOR PIPELINING AN ERROR DETECTION ALGORITHM ON AN N-BIT WORD STORED IN MEMORY

[75] Inventor: Christopher S. Maclellan, Norwood, Mass.

[73] Assignee: EMC Corporation, Hopkinton, Mass.

[21] Appl. No.: 936,695

[22] Filed: Sep. 24, 1997

[51] Int. Cl.[6] .................................................. G06F 11/00
[52] U.S. Cl. .................................. 371/40.13; 371/40.12; 711/169; 711/105
[58] Field of Search .................................. 711/169, 105; 371/185.01, 40.12, 40.13

[56] References Cited

U.S. PATENT DOCUMENTS

| | | | |
|---|---|---|---|
| 4,845,664 | 7/1989 | Aichelmann, Jr. et al. | 711/105 |
| 4,951,246 | 8/1990 | Fromm et al. | 711/169 |
| 5,490,155 | 2/1996 | Abdoo et al. | 371/40.11 |
| 5,623,506 | 4/1997 | Dell et al. | 371/40.4 |
| 5,754,753 | 5/1998 | Smelser | 395/182.06 |

*Primary Examiner*—Krisna Lim
*Attorney, Agent, or Firm*—Fish & Richardson P.C.

[57] ABSTRACT

A method of pipelining an error detection algorithm on an n-bit data word stored in a memory whereby the n-bit data word is first divided into segments. Then, each of the segments of the n-bit data word is read out from memory. Upon receiving a first of the segments, a portion of the error detection algorithm is computed using the first segment to produce a first error check result. Then a next one of the segments of the data word is received, upon which a next portion of the error detection algorithm is computed using the next segment and a most recently calculated check result of a computation of a prior portion of the error detection algorithm. This produces a revised error check result. If necessary, the above-described steps are repeated until all of the segments of the data word have been processed, wherein the revised error check result computed for the last segment is an error detection syndrome for the complete data word.

8 Claims, 4 Drawing Sheets

5,878,059

METHOD AND APPARATUS FOR PIPELINING AN ERROR DETECTION ALGORITHM ON AN N-BIT WORD STORED IN MEMORY

BACKGROUND OF THE INVENTION

The invention relates generally to a DRAM memories and, more specifically, to a fault tolerant design for such memories.

In the past large digital memories have been implemented using large arrays one bit DRAM (Dynamic Random Access Memories), i.e., DRAM made up of a very large number of single bit cells. More recently, DRAM made up of 4-bit cells has become popular and the prices of such devices have dropped sufficiently to make their use in systems requiring very RAM or cache storage more practical. However, the 4-bit DRAM has characteristics that are different from the single bit DRAM. For example, one cannot simply write directly to a single bit location in one of the 4-bit cells within the DRAM chip but rather must write to all four locations in the cell. These differences have produced some issue regarding how to utilize the 4-bit DRAM in existing system designs.

SUMMARY OF THE INVENTION

In general, in one aspect, the invention is a method of pipelining an error detection algorithm on an n-bit data word stored in a memory. The method includes the steps of (a) defining segments of the n-bit data word; (b) sequentially reading out each of said segments of the n-bit data word from the memory; (c) upon receiving a first of the segments, computing a portion of the error detection algorithm using the first of the segments to produce a first error check result; (d) receiving a next one of the segments of the data word; (e) computing a next portion of the error detection algorithm using the next one of the segments and a most recently calculated check result of a computation of a prior portion of the error detection algorithm to produce a revised error check result; and (f) if necessary, repeating steps (d) and (e) until all of the segments of the data word have been processed, wherein the revised error check result computed for the last segment is an error detection syndrome for the complete data word.

Preferred embodiments include the following features. The method also includes the steps of performing step (c) before receiving a next segment; and using a Hamming code (e.g. a modified Hamming code) to implement the error detection algorithm.

In general, in another aspect, the invention is an apparatus for pipelining an error detection algorithm on an n-bit data word. The apparatus includes (a) memory storing the n-bit data word; (b) means for sequentially reading out each of a m segments of the n-bit data word from the memory, wherein m is an integer greater than one; (c) m stages, each of which is programmed to compute a different portion of the error detection algorithm using a different one of the m segments to produce a corresponding error check result, wherein each of the stages after a first stage receives the error check result from a prior stage and wherein the error check result from a last one of the m stages is a complete error syndrome for the n-bit data word.

In preferred embodiments, the m segments have an equal number of bits (e.g. m=4). The memory includes an array of DRAM chips, each of which includes a plurality of m-bit storage cells.

Other advantages and features will become apparent from the following description of the preferred embodiment and from the claims.

DESCRIPTION OF THE PREFERRED EMBODIMENTS

In the described embodiments, an n-bit word is stored across n different DRAM chips. More specifically, each bit of the n-bit word is stored in the same location of the 4-bit cell that is located in a different DRAM chip. One implication is that each 4-bit cell contains data for four different words. However, since a characteristic of the 4-bit DRAM chips is that data cannot be written to a single bit location in a 4-bit cell, we also provide read-modify-write circuitry, such as is illustrated in FIG. 1, that enables the CPU to modify data in less than all of the locations of a 4-bit cell without destroying the old data in the other locations of the cell.

Figure 1:
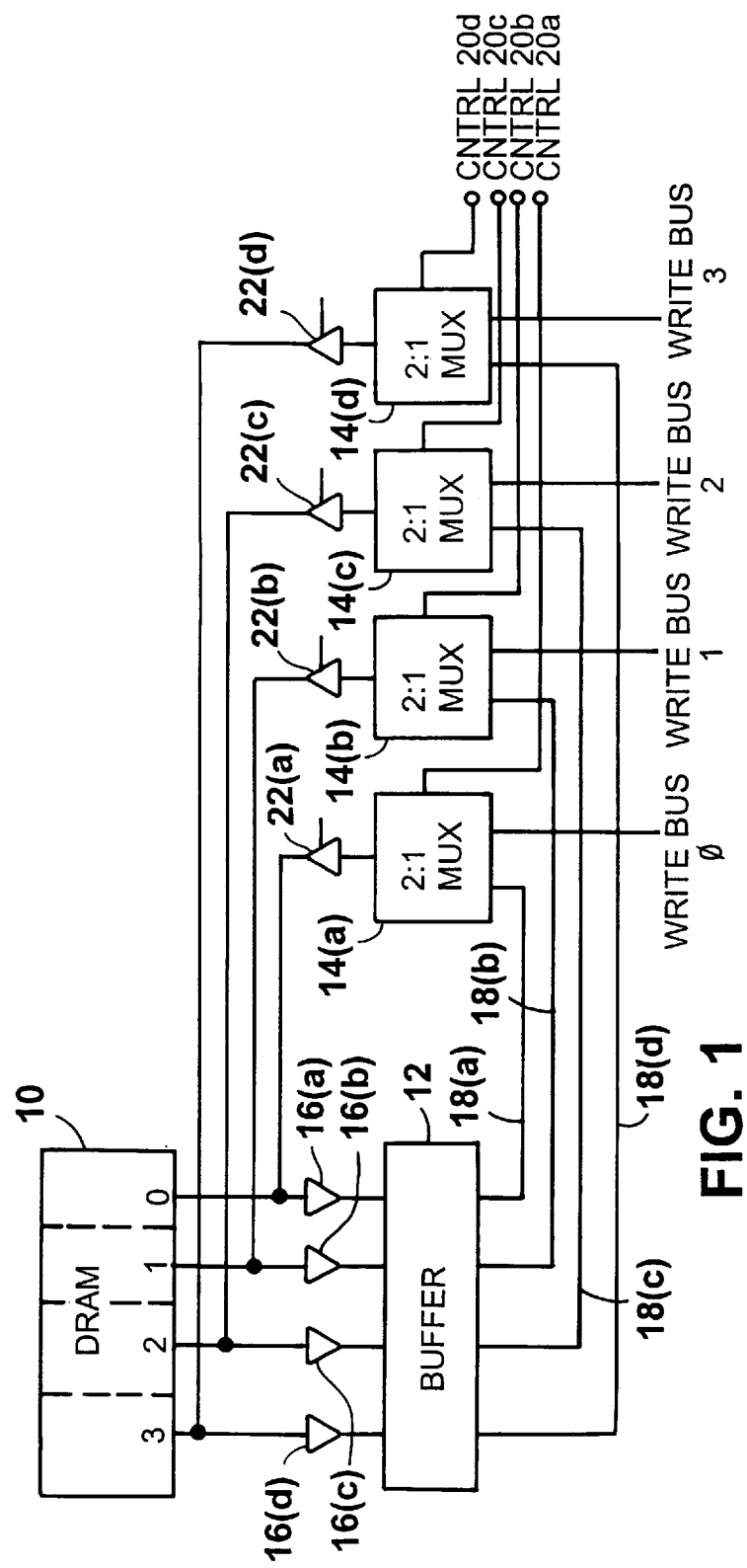
FIG. 1 is block diagram of a simple circuit that is used to illustrate the invention.

To aid in the understanding of the operation of the memory circuitry, the circuit of FIG. 1 shows only a single 4-bit cell and the read-modify-write circuitry associated with that cell. After describing this simplified circuit, we will then describe a complete circuit that stores 72 bit words.

The simplified read-modify-write circuit shown in FIG. 1 includes a 4-bit DRAM cell 10, a buffer memory 12, and four 2:1 multiplexers (i.e., MUX's) 14(*a–d*) (also generally referred to as MUX's 14). Four input/output lines from DRAM cell 10, one for each location of the 4-bit cell, connect DRAM cell 10 through gates 16(*a–d*) to four corresponding input lines of buffer 12. Buffer 12 also includes four output lines 18(*a–d*), each of which connects to a first input line of a corresponding different one of the 2:1 MUX's 14. A second input line on each of the MUX's 14 receives input from a corresponding line of a write bus through which the system CPU writes new data into DRAM cell 10. Each of the MUX's 14 is controlled by a separate control signal (CNTRL) 20(*a–d*) that determines which of the first and second input lines is selected to supply the output signal for that MUX. The output of each of the MUX's 14 is connected through a corresponding gate 22(*a–d*) to a corresponding input/output line of the DRAM cell.

The simplified system shown in FIG. 1 works as follows. Suppose that the system (e.g. a CPU) wants to write new data to location 1 in the 4-bit DRAM cell. To accomplish this, the memory system first reads the contents of the entire 4-bit cell into buffer 12. At some point, the CPU also places the new data onto the write bus 1. This latter operation, which is completely autonomous from the read operation that was just described, can occur at any time prior to, during, or after the read operation. In any event, when both the old data is stored in buffer 12 and the new data is available on the write bus 1, control signals 20(*a–d*) is sent to MUX's 14 instructing them to select the appropriate input lines for the data that is to be written back to DRAM cell 10. Then, the selected data signals are written into the four locations of the 4-bit cell in the DRAM chip.

In the present example, since we have assumed that new data is to be written to location 1 of the 4-bit cell, control signal 20 instructs MUX 1 to select the input signal from its write bus input line and it instructs the other MUX's to select the input signals provided by buffer 12. The memory system then writes the selected data into the 4-bit DRAM cell, replacing what was originally stored there. After the write to DRAM cell is complete, the 4-bit cell contains the old data in locations 0, 2, and 3 and it contains the new data in cell location 1.

The same general procedure (i.e., the read-modify-write sequence) is used for writing any new data to the 4-bit cell that involves replacing less than all of the data that is stored in the cell with new data. The control signal simply selects which one or more of the write bus lines are to provide the new data. However, if the CPU write a new data to all of the locations in the 4-bit cell, then the memory system does not perform the read-modify-write procedure but rather it simply overwrites the old data with the new data supplied by the CPU on the write bus.

Figure 3:
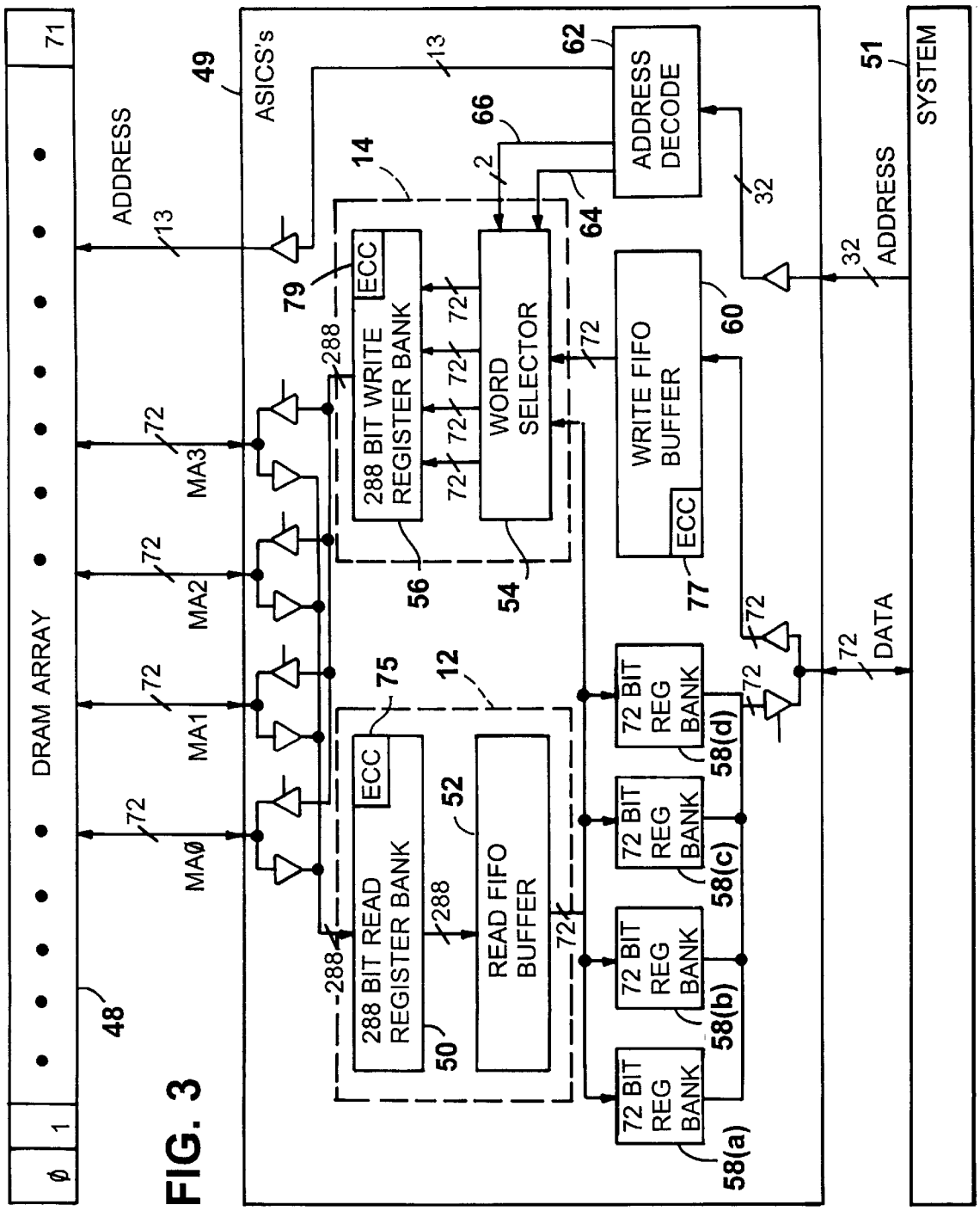
FIG. 3 is a block diagram of a memory circuit for storing 72 bit data words.

FIG. 3 shows a circuit that stores data words that are 72 bits long and that incorporates the principles described above. In each 72-bit word, the top 8 bits are ECC bits and the remaining 64 bits are data bits. In this example, the memory includes a DRAM array 48 which is made up of at least 72 DRAM chips, each of which can include millions of 4-bit cells. As indicated above, distributing the data across chips in this manner results in correctable errors even if an entire DRAM chip fails. That is, a single chip failure will only produce a single bit error in the data words that use that chip. Though, of course, a DRAM chip failure will result in a single bit error in all of the data words that use that DRAM chip, and that can easily number in the millions.

The lower limit on the number of DRAM chips in the DRAM array is established by the size of the words that are to be stored in memory. The upper limit is determined by how much memory is desired and thus the number of DRAM chips that implement the DRAM array can be very large. Any one of variety of commercially available DRAM chips could be used to implement DRAM array 48. For example, in the described embodiment the DRAM chip is a KM44V16004A CMOS dynamic RAM chip from Samsung Electronics Co., Ltd., which contains over 16 million 4-bit cells.

Each data word stored in the DRAM array is spread across multiple DRAM chips. The DRAM chips are interconnected so that each bit of a 72 bit data word is stored in a different one of 72 DRAM chips. More specifically, each bit of the data word is stored in the same location of a 4-bit cell that resides in a different one of the 72 DRAM chips. For example, each bit of a given data word might be stored in bit location 0 of a 4-bit cell in a different chip. Thus, each 4-bit cell in a DRAM chip stores data bits for four different 72-bit data words. When a read is performed on the memory system to read one of the 72 bit data words stored in DRAM array 48, the memory system presents all four data words that are stored in the 72 4-bit cells that contain the target word.

Before describing the circuit shown in FIG. 3, we will first describe the organization of address space in the DRAM array.

Figure 2:
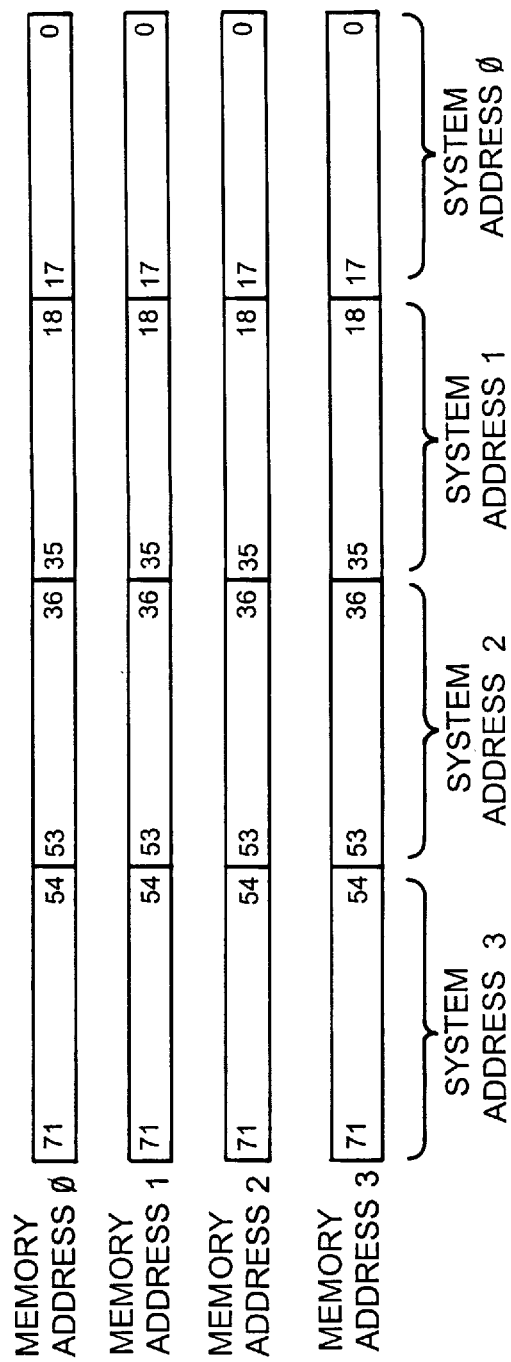
FIG. 2 is diagram showing how system address space and memory address space map to each other.

The memory system uses a different address space from that used by the CPU. For the CPU, each 72 bit word is stored at a specified system address. In the memory system, however, data is stored at memory addresses, which are different from system addresses. Each system data word or bus word is stored across four contiguous memory addresses. The mapping between memory addresses and system addresses is illustrated in FIG. 2. In general, the data stored at four contiguous system addresses map to four memory addresses. In other words, the memory system divides system address space into blocks of four system addresses, i.e., it defines and recognizes four word boundaries within system address space (i.e., boundaries separated by four words). The main system or CPU is not aware of the four word boundaries or of the addressing of the memory address space. Rather, the memory system itself performs the mapping of system addresses to the appropriate set of memory addresses, without requiring any knowledge or participation on the part of the CPU.

In FIG. 2, there are four memory addresses, designated as Memory Address 0 through Memory Address 3 (also referred to as MA 0 through MA 3). This group of four memory addresses stores the data words for a corresponding group of four system addresses. In this example, the four system addresses are System Address 0 through System Address 3 (also referred to as SA 0 through SA 3). As indicated, the 72 bit word at each memory address in the memory system is divided into four 18 bit segments, each segment representing an 18 bit portion of a different system data word. The four segments include bits 0–17, bits 18–35, bits 36–53, and bits 54–71. The bits of a single system data word are stored in the same 18 bit fields of four memory addresses. For example, the top 18 bits (i.e., bits 54–71) of the word at SA 3 are stored in bit locations 54–71 of MA 0; the next 18 bits (i.e., bits 36–53) are stored in bit locations 54–71 of MA 1; the next 18 bits are stored in locations 54–71 of MA 2, and the last 18 bits are stored in bit locations 54–71 of MA 3.

Similarly, the word at SA 1 is stored in bit locations 36–53 of MA 0 through MA 3, the word at SA 2 is stored in bit locations 18–35 of MA 0 through MA 3, and the word at SA 3 is stored in bit locations 0–17 of MA 0 through MA 3.

It should be apparent from the above description that the 72-bits of data at a given memory address location are stored over 18 different chips, 4 bits per chip. Also, one bit from each 18 bit field of the data stored at a given memory address is stored in a 4-bit cell of a particular DRAM chip. For example, bits 71, 53, 35, and 17 are stored in a 4-bit cell within a DRAM chip. And similarly, for the rest of the data bits of the 72-bits of data at that memory address.

Returning to FIG. 3, the read-modify-write circuit is implemented on two ASIC (application specific integrated circuit) chips 46 that sit between system 51 and DRAM array 48. One ASIC handles control signals and addressing; the other ASIC handles the data, error detection, and MUXing. The ASICs do the remapping of system addresses to memory addresses and it recognizes the four words boundaries in system address space. That is, the ASICs know which four memory addresses to bring out to access the system address(es) that was (were) specified by the CPU.

Within the ASICs, the previously described buffer 12 is represented by a 288 bit read register bank 50 connected in series with a read FIFO buffer 52 and the 4 MUX's 14 are represented by a word selector module 54 connected in series with a 288 bit write register bank 56. Read register bank 50 has 288 input lines for receiving data from DRAM array 48 and it has 288 output lines connecting it to read FIFO buffer 52. Word selector module 54 has two 72-bit inputs and four 72-bit outputs. The output of read FIFO buffer 52 is presented on a 72 bit wide bus that connects to one of two inputs of word selector module 54 and to four 72-bit register banks 58(a–d). The four 72-bit register banks 58(a–d), each of which is for a different one of the four system address words, are used to read data out of the system to the CPU.

The purpose of read register bank 50 is to latch data from the DRAM array and pass it to the ECC check logic and to the read FIFO buffer. This allows the DRAM array to prepare the next word as soon as possible, increasing memory throughput. That is, the read register bank in series with the read FIFO buffer produces a pipelined stage design that produces enhanced performance.

The main system or CPU writes the data words that are intended for memory into a write FIFO buffer 60 where they are held until needed for transfer into DRAM array 48. The main system or CPU also provides a 32 bit address identifying the system address to which the new data word is to be written. An address decoder 62 decodes this to generate a 13 bit memory address that is sent to DRAM array 48, a selector bit signal 64 that controls which of its two inputs the word selector module uses for its input signal, and an output control signal 66 which identifies the particular one of the four outputs on which the selected word will appear for transfer into the write register bank 56. The output control signal is the two least significant bits of the 32-bit address provided by the system.

The data that is stored in the read register bank 50 has the same arrangement as the data that is stored in DRAM array 48. That is, the data is stored in read register bank 50 as memory address words, i.e., system data words are interleaved with each other. However, when that data is transferred into read FIFO buffer 52, it is reorganized to form system address data words or bus words. Thus, the data words that fall through read FIFO buffer 52 and appear at its output will be the 72-bit system data words or bus words.

In general, the circuit of FIG. 3 operates as follows. Assuming that the CPU wants to modify less than four data words in a block of four system bus words, the memory system reads all 288 bits for the four data words in that block into a buffer. Then, it replaces selected ones of those data words with new data words from the CPU. With the selected words replaced, it them writes the 288 bits back to the DRAM array, overwriting the information that was previously stored there.

In actuality, if the circuit of FIG. 3 were to read all 288 bits at one time into register bank 50 that would tend to cause switching noise, ground bounce, and VDD droop, all of which will contribute to increasing error rates and corruption of data signals. Thus, to avoid this problem the circuit staggers the reading of the bits into read register bank 50 over 4 clock cycles, transferring only 72 bits per cycle. That is, the memory system moves data out of the DRAM array 72 bits at a time from memory address locations. The following example will illustrate the details of Again assume that the CPU notifies the memory system that it wants to write a new data word to SA 1. The memory system determines that the data word stored at SA 1 is stored in fields 36–53 of four memory address locations in DRAM array, i.e., MA 0–MA 3. Thus, it transfers in sequence the words stored at MA 0, MA 1, MA 2, and MA 3 into read register bank 50. After the first part of the transfer is complete (i.e., the transfer of the word stored at MA 0), there will be portions (i.e., 18 bits) of four different data words stored in read register bank 50, one of which is the data word at the target address. At the end of four cycles, all of the 288 bits of the four data words (stored in MA 0–MA 3) will be stored in read register bank 50.

The 288 bits stored in the read register bank 50 are then transferred into read FIFO buffer 52. This transfer is also done in a staggered fashion, as described above. The data words are stored in read FIFO buffer 52 in order of increasing system addresses so that the first word transferred out of read FIFO buffer 52 will be the data word that is assigned to SA 0.

At some point, the CPU provides to write FIFO buffer 60 the data that is to be written to SA 1. In addition, after the successful transfer of data out of DRAM array 48 and into read FIFO buffer 52, the memory system instructs the DRAM chips in the array to stop driving the data bus and to get ready for a write. When, both read FIFO buffer 52 and write FIFO buffer 60 contain the data that is to written back to DRAM array 48, the memory system puts the first data word stored in read FIFO buffer 52 and the first word stored in write FIFO buffer 60 onto the corresponding input lines of word selector module 54 and it sends the appropriate selector and control signals 64 and 66 to word selector module 54. In this case, since the system is writing back the data that was stored in DRAM array 48, the selector signal 64 instructs word selector module 54 to select its left input, i.e., the input from read FIFO buffer 52, for the input data and to place that data on its leftmost output line for transfer into write register bank 56.

After the old data from SA 0 has been transferred into write register bank 56, the system then gets ready to write the data word for SA 1. In this case, that will be new data supplied by the CPU. Thus, selector signal instructs word selector 54 to accept as input the signal on its rightmost input line (i.e., the line from write FIFO buffer 60) and the control signal instructs word selector module 54 to place this on its second output line. Thus, the new data word for SA 1 is transferred into write register bank 56.

The remaining two words for SA 2 and SA 3 are obtained from read FIFO buffer 52 and also stored in write register bank 56 for transfer into DRAM array 48. As in the case of read register bank 50, the data that has been transferred into write register bank 56 is interleaved, i.e., it is stored according to memory addresses. This is accomplished automatically by the manner in which the input lines are wired into write register bank 56.

The data in write register bank 56 is then transferred into DRAM array 48, overwriting the data that was previously stored in MA 0 through MA 3. Like the transfer of data into the read register bank, this is also done in a staggered fashion.

The memory is capable of accepting DMA burst transfers of up to 32 bus words per transfer. The burst which specifies a start address and the number of words that are to be written can start at any address in the global range. The read-modify-write cycle can occur at the start of the burst, at the end of the burst, or both. Regardless of where the read-modify-write cycle is necessary, the read portion of the cycle happens at the start of the transfer and is stored in a buffer. As the ASICs receive four words from the write bus, they are interleaved into a memory word. If the current memory word to be written requires a read-modify-write cycle, the read portion is taken from the buffer where it was stored and the new bus word(s) is (are) interleaved in and written back, completing the read-modify-write cycle.

As an example of a burst transfer assume that the system provides the starting address as SA 1 and the number of words that are to be written as ten. Since SA 1 falls within the first block of four words, the memory system performs a read-modify-write cycle to read out words in SA 0–SA 3, modify words SA 1–SA 3, and write them back to the DRAM array. For the next four words, since all four of them are to be written to DRAM array, the memory system does not perform the read-modify-write cycle but it simply writes the next four words directly to SA 4 through SA 7. Finally, for the last four words, only three of them are to be modified, namely, SA 8–SA 10; so the memory system again performs a read-modify-write cycle on words at SA 8–SA 11 to update the first three words on that block. Note, however, that all of the read operations are first performed from the DRAM array to read the appropriate sequence of words into the read FIFO buffer. That is, the words for addresses SA 0 through SA 3 are read into the read FIFO buffer and then the words for addresses SA 8 through SA 11 are read into read FIFO buffer. This is done before any writes to the DRAM array are performed. Thus, the DRAM array can be setup for one continuous sequence of writes to complete the burst transfer.

Error Detection circuitry

As indicated previously, the ASIC contains circuitry that performs error detection at three different locations. It performs error detection on data that is in read register bank 50, on data that is in write FIFO buffer 60, and on data that is in write register bank 56. To perform this error detection read register bank 50, write FIFO buffer 60, and write register bank 56 include error detection circuitry 75, 77, and 79, respectively (also referred to as ECC circuits 75, 77, and 79).

In the described embodiment, the error detection circuitry implements a modified Hamming code to perform the error detection. Modified Hamming codes are well known to persons skilled in the art and the particular details of the particular code that is used are not of central importance. Suffice it say that the modified Hamming code can detect and corrects single bits errors and it can detect but not correct double bit errors. In general the algorithms based on the Hamming codes uses generator matrices to produce a "syndrome" from all of the bits of the full data word. In the case of the 72-bit words with 8-bit error codes, there are eight such generator matrices, one for each of the eight bits. In general, each generator matrix defines an XOR reduction (i.e., an addition without a carry) of a certain set of bits from the data word. The generator matrices are typically 18–25 bits long. When all of the generator matrices are applied to the data word, including the ECC bits, they produce the syndrome.

In the case of read register buffer 50, the error detection is performed in a pipelined fashion. That is, even though the four bus words will not be completely available until all of the 288 bits have been transferred from DPAM array 48, the error detection nevertheless is performed on each partial words (i.e., quarter words) as soon as it becomes available and before the remaining portions of the word are provided by the DRAM array. The result of each partial error detection is passed forward to be combined with the error detection that is performed on the next quarter word that is received. After the last stage of processing, the result is the syndrome for the error detection algorithm. The manner in which this is accomplished for one of the four bus words is shown in greater detail FIG. 4. Note that each of the four bus words is processed in precisely the same manner.

Figure 4:
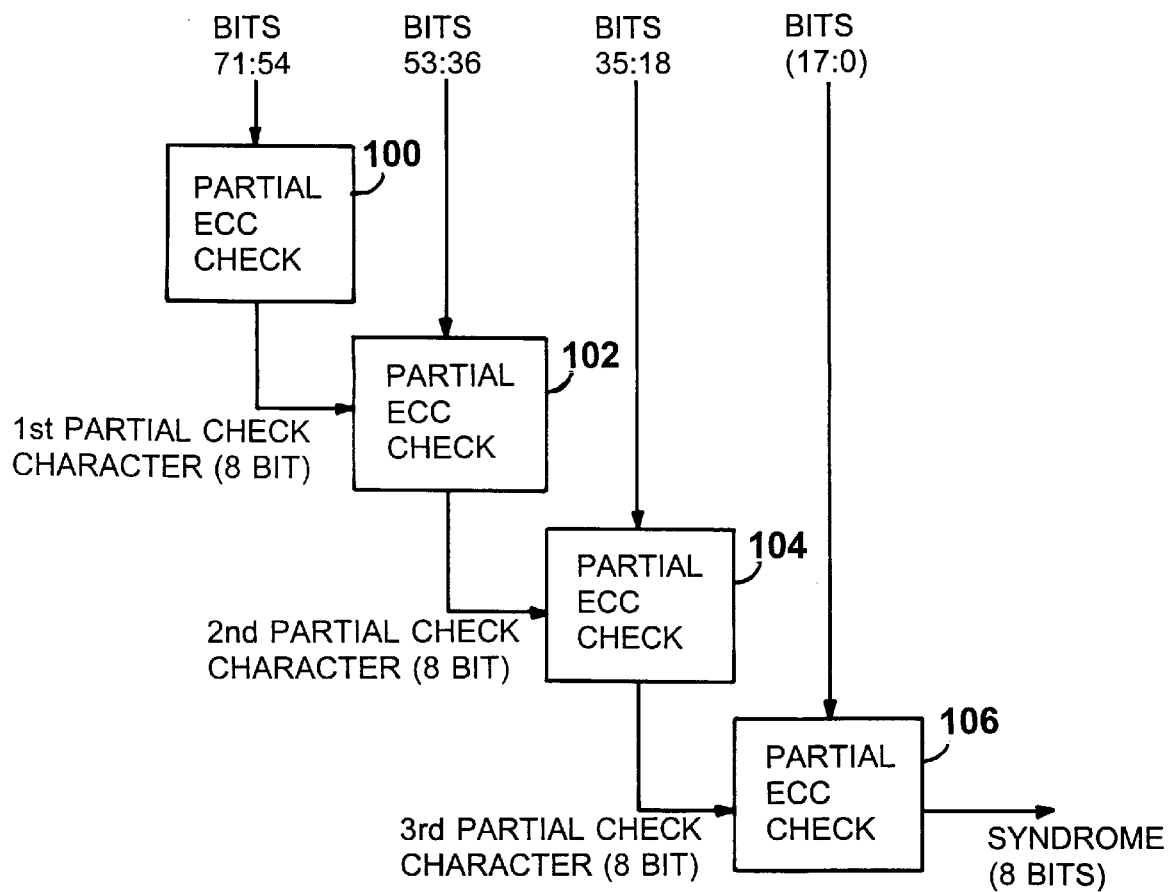
FIG. 4 is a block diagram of the error detection algorithm that is performed in the read register bank.

Error detection circuit 75 has four stages shown in FIG. 4 as stages 100, 102, 104, and 106. In the described embodiment, the four stages are implemented by hardwired logic gates and there are registers for storing partial results. After the data word for the first memory address (e.g. MA 0), read register bank contains the top 18 bits (i.e., the first quarter word) of each of the four data words for SA 0–SA 3. In the case of bits 54:71 (i.e., the first quarter word) for the data word for SA 0, stage 100 of ECC circuit 75 performs error detection on that quarter word to produce a first 8 bit partial check character, which is stored in a register for later use. After the next 72 bit block of data for MA 1 arrives, stage 102 performs a further error detection on the second quarter word (i.e., bits 36:53) of the data word for SA 0, and in doing so, it uses the first partial check character that was obtained from stage 100. The output of stage 102 is a second partial check character, which is again stored in a register for later use. This process is repeated for the next two stages 104 and 106 to produce the final syndrome for the complete data word. The resulting syndrome is equal to the syndrome that would have been produced if the error detection algorithm had been performed on the entire word all at one time.

The resulting syndrome, as is well know to persons skilled in the art, indicates whether the data word contains a single bit error and its location and whether it contains any double bit errors. The memory system interprets the syndrome and if appropriate signals the CPU if there is a correctable error or a detectable error. If there is a single bit error, the memory system sends the data word with its ECC bits to the CPU and the CPU will calculate the syndrome. The CPU then executes the appropriate error correction algorithm to correct the single bit error. If there is a double bit error, which is not correctable by the modified Hamming code, the CPU generates an appropriate error message.

An important characteristic of the modified Hamming codes that makes it possible to perform the error detection algorithms in this pipelined fashion is that it is associative, i.e. the result is not affected by how the operations are grouped. We further note that the modified Hamming codes are also commutative, i.e., the result is not affected by the order in which the operations are performed. The associative feature permits one to perform the test in stages, i.e. in this pipelined fashion, without affecting the result that is produced.

Any code which has the properties of being associative and commutative can be used in the manner described above, without requiring any fundamental modification to the error detection algorithm. Indeed, many codes that only have the property of being associative will also lend themselves to this pipelines approach.

For any data words at system addresses to which the CPU is writing new data, the memory system ignores the results of the error detection algorithm for those words since they will be replaced with new data. Internally, the memory keeps track of the occurrence of the detection of the errors in such words but it does not inform the CPU.

If there is an error on a read-modify-write word that is not being overwritten, the memory system does not signal the CPU but rather it stores this information in a local status register. This is because the read-modify-writes are performed transparently to the CPU which means that the CPU has no knowledge that the other addresses in a block are involved in a transfer which affects less than all of the words in that block. However, the CPU does routinely check the status register at regular intervals and takes appropriate action when it detects that an error has occurred.

Note that the ECC checks are also performed in this pipelined fashion in write register bank 56.

The invention is meant to cover all of the above-mentioned alternative approaches as well as others not specifically mentioned. The above-mentioned embodiments and others are within the following claims.

What is claimed is:

1. A method of pipelining an error detection algorithm on an n-bit data word stored in a memory, said method comprising:

(a) defining segments of the n-bit data word;

(b) sequentially reading out each of said segments of the n-bit data word from said memory;

(c) upon receiving a first of said segments, computing a portion of the error detection algorithm using said first of said segments to produce a first error check result;

(d) receiving a next one of said segments of said data word;

(e) computing a next portion of the error detection algorithm using said next one of said segments and a most recently calculated check result of a computation of a prior portion of the error detection algorithm to produce a revised error check result; and (f) if necessary, repeating steps (d) and (e) until all of said segments of the data word have been processed, wherein the revised error check result computed for the last segment is an error detection syndrome for the complete data word.

2. The method of claim 1 further comprising performing step (c) before receiving a next segment.

3. The method of claim 1 further comprising using a Hamming code to implement the error detection algorithm.

4. The method of claim 3 further comprising using a modified Hamming code to implement the error detection algorithm.

5. An apparatus for pipelining an error detection algorithm on an n-bit data word, said apparatus comprising:

(a) memory storing the n-bit data word;

(b) means for sequentially reading out each of a m segments of the n-bit data word from said memory, wherein m is an integer greater than one;

(c) m stages, each of which is programmed to compute a different portion of the error detection algorithm using a different one of the m segments to produce a corresponding error check result, wherein each of said stages after a first stage receives the error check result from a prior stage and wherein the error check result from a last one of said m stages is a complete error syndrome for the n-bit data word.

6. The apparatus of claim 5 wherein the m segments have an equal number of bits.

7. The apparatus of claim 5 wherein the memory comprises an array of DRAM chips, each of which includes a plurality of m-bit storage cells.

8. The apparatus of claim 7 wherein m equals four.

* * * * *